US006657263B2

United States Patent
Ni

(10) Patent No.: US 6,657,263 B2
(45) Date of Patent: Dec. 2, 2003

(54) MOS TRANSISTORS HAVING DUAL GATES AND SELF-ALIGNED INTERCONNECT CONTACT WINDOWS

(75) Inventor: Cheng-Tsung Ni, Hsinchu (TW)

(73) Assignee: Mosel Vitelic, Inc. (TW)

(*) Notice: Subject to any disclaimer, the term of this patent is extended or adjusted under 35 U.S.C. 154(b) by 0 days.

(21) Appl. No.: 09/896,205

(22) Filed: Jun. 28, 2001

(65) Prior Publication Data

US 2001/0049165 A1 Dec. 6, 2001

Related U.S. Application Data

(62) Division of application No. 09/534,699, filed on Mar. 24, 2000, now Pat. No. 6,284,578.

(30) Foreign Application Priority Data

Mar. 26, 1999 (TW) .......................................... 88104775

(51) Int. Cl.$^7$ .............................................. H01L 29/76
(52) U.S. Cl. ...................................................... 257/371
(58) Field of Search ................................. 257/368, 371, 257/374, 377, 382, 384

(56) References Cited

U.S. PATENT DOCUMENTS 5,759,882 A * 6/1998 Kao et al. .................... 438/202
5,866,451 A * 2/1999 Yoo et al. .................... 438/241
6,207,514 B1 * 3/2001 Furukawa et al. .......... 438/299

* cited by examiner

Primary Examiner—David Nelms
Assistant Examiner—Quoc Hoang
(74) Attorney, Agent, or Firm—Heller Ehrman White & McAuliffe

(57) ABSTRACT

A method of fabricating an IC device on a substrate comprising MOS transistors and other IC components. Each of the transistors of the IC device comprises a raised source electrode, a raised drain electrode, dual gate electrodes and self-aligned interconnect contact windows, and is connected to other transistors and other IC components through interconnects formed on top of such self-aligned contact windows.

6 Claims, 6 Drawing Sheets

MOS TRANSISTORS HAVING DUAL GATES AND SELF-ALIGNED INTERCONNECT CONTACT WINDOWS

This application is a continuation of commonly assigned, U.S. patent application Ser. No. 09/534,699 filed Mar. 24, 2000, now issued as U.S. Pat. No. 6,284,578.

BACKGROUND OF THE INVENTION

1. Field of the Invention

This invention relates generally to processes for fabricating metal-oxide-semiconductor (MOS) transistors, and in particular to a new process for fabricating MOS transistors having dual gate electrodes and self-aligned contact windows for interconnects.

2. Description of the Prior Art

Semiconductor devices are constantly being miniaturized. As both semiconductor devices and lithographic line widths for making such devices become smaller and smaller, hundreds of thousands of integrated circuit (IC) components, including metal-oxide-semiconductor field-effect transistors (MOSFETs) and other metal-oxide-semiconductor (MOS) and complementary metal-oxide-semiconductor (CMOS) components, are packed onto each square centimeter of a semiconductor substrate. Thus, semiconductor technologists constantly strive to improve IC device structure and processing methods under the relentless pressure imposed by shrinking devices having ever-tightening functional requirements, e.g., lower and lower operating voltage and power consumption.

The fabrication of field-effect transistors involves the formation of n-type and p-type doped regions. As the transistor is made smaller and smaller, the formation of very shallowly doped regions, i.e., "shallow junctions," become a very challenging task. Shallow junctions, when properly formed, can mitigate various undesirable effects caused by short channels, leakage current, contact resistance and sheet resistance. However, until very recently, myriads of technical difficulties have plagued the formation of shallow junctions. See, for example, U.S. Pat. No. 5,763,319, titled "Process for Fabricating Semiconductor Devices with Shallowly Doped Regions Using Dopant Compounds Containing Elements of High Solid Solubility," issued to Ling et. al. on Jun. 6, 1998.

The use of raised source and drain has recently been adopted as an alternative technique for forming a shallow junction in a field-effect transistor. Thus, landing pads are first formed at the surface regions of the substrate where the source and the drain are to be formed; meanwhile, a resist mask protects the active region where the gate electrode of the transistor is to be formed. Dopant ions are then implanted in the pads through a conventional ion implantation process. The implanted dopant ions are made to diffuse, typically by way of thermal treatment, into the designated substrate surface regions to form the raised source and drain. Subsequently, the protective resist mask is removed, and the gate electrode is formed at the active region. Various other elements of the semiconductor devices, such as the conductors and the dielectric layers, are sequentially formed on the substrate to complete the fabrication of the transistor. Finally, interconnects are formed to link up the transistors and other components of the semiconductor device.

Although recent progresses has made it easier to form field-effect transistors with raised sources and drains, the constant miniaturization of semiconductor devices dictates that other improvements be made to the formation of the transistors and the interconnects. For example, as the lithographic line width is reduced to 0.25 μm or smaller (i.e., deep sub-micron), it becomes more and more difficult to control the critical dimensions of semiconductor devices through conventional exposure and etching schemes. Device miniaturization also places great strain on the device planarization requirement particularly when such devices include raised sources and drains. In short, the mere incorporation of raised source and drain in transistors is insufficient to solve all the problems associated with the fabrication of ever-shrinking semiconductor devices.

It is well-known that the function of a field-effect transistor depends to a great extent on its threshold voltage. Threshold voltage, in turn, depends on the electronic properties of the semiconductor material constituting the IC component. For example, the threshold voltage of a p-type CMOS transistor having a single dopant in its conductor may be incompatible with that of an n-type CMOS transistor also having a single dopant in its conductor, thus preventing these CMOS transistors from optimally operating together. In addition, the reduction in size of the CMOS transistors, together with the requirement for lower operating voltage and power consumption, dictates that the threshold voltages of these CMOS transistors be made as small as practicable. Hence, double dopant implantation in the gate electrode of the transistors has been proposed to help reduce the threshold voltages of the transistors.

Further, in a typical semiconductor device, hundreds of thousands or even millions of field-effect transistors are linked to one another through interconnects, which generally have to be formed on an insulator to ensure electrical insulation. The conventional process for making interconnects involves: planarizing the semiconductor structure comprising the IC components that have just been fabricated; depositing an insulating layer on the IC components; lithographically defining and forming (by, e.g., etching) contact windows for the interconnects; and depositing conductor material (by, e.g., contact metalization) to form the interconnects. As IC components are made smaller and smaller, such a process becomes more and more difficult. For example, photomask pattern shifts during contact metalization increase greatly; and etching difficulties also rise sharply. All these tend to reduce the yield of the overall IC device fabrication process.

SUMMARY OF THE INVENTION

Accordingly, it is an object of the present invention to provide a new semiconductor processing method that facilitates the formation of transistors having raised source and drain electrodes.

Another object of the present invention is to provide a method for fabricating MOS transistors with raised sources and drains and dual gate electrodes.

Still another object of the present invention is to provide a method for forming an IC device comprising transistors with self-aligned contact windows for interconnects.

In accordance with the objects described above, the present invention provides a method of fabricating an IC device comprising MOS transistors and other IC components; the transistors have raised source and drain electrodes and dual gate electrodes; and the transistors and other IC components are interconnected through the use of self-aligned contact windows. Essentially, this method comprises the following steps:

Forming on a semiconductor substrate a plurality of isolation regions to separate a plurality of active regions;

forming a well in the substrate doped with a first type of dopants;

forming a first gate structure on an active region and a second gate structure on an adjacent isolation region, either gate structure comprising a gate electrode layer of a first conductor material and a first dielectric layer; the second gate structure having a larger surface area than the first gate structure;

deposited an etch-stop layer on top of the substrate and the gate structures;

forming a second dielectric layer on those portions of the substrate that are not covered by the gate structures;

forming a mask layer on the second gate structure and on those portions of the second dielectric layer that are not next to the first gate structure;

removing those unmasked portions of the second dielectric layer next to the first gate structure to form two trenches next to the first gate structure;

removing the mask layer;

depositing a second conductor material in the two trenches to form two conductor columns;

removing the first dielectric layers of the first and second gate structures;

doping the gate electrode layers of the first and second gate structures with a second type of dopants to form the dual gate electrodes;

diffusing the second type of dopants into the substrate to form the raised source and drain electrodes;

forming side walls of a third dielectric material;

forming self-aligned silicides on the two conductor columns and the two gate electrode layers;

forming a third dielectric layer on top of the two gate electrode layers to cover the first gate electrode layer entirely and the second gate electrode layer partially and to form self-aligned contact windows; and forming the interconnects at the contact windows to connect the conductor columns and the second gate electrode layer to other transistors and IC components on the substrate.

Essentially, the MOS fabrication process disclosed herein has the following significant advantages over those taught in the conventional art:

An advantage of the present invention is that it is more compatible with deep submicron semiconductor processes than the conventional art for forming interconnected semiconductor transistors.

Another advantage is that the IC device fabricated by the present method can be operated at a lower voltage and has lower power consumption than conventional IC devices because the transistors of the new IC device generally have lower threshold voltages.

Yet another advantage of the present invention is that it reduces planarizing difficulties during device fabrication, thus making it easier to create multilayer, multi-metalization devices.

These and other objects, features and advantages of the present invention will no doubt become apparent to those skilled in the art after reading the following detailed description of the preferred embodiment which is illustrated in the several figures of the drawing.

IN THE DRAWINGS

DETAILED DESCRIPTION OF THE PREFERRED EMBODIMENTS

Figure 1:
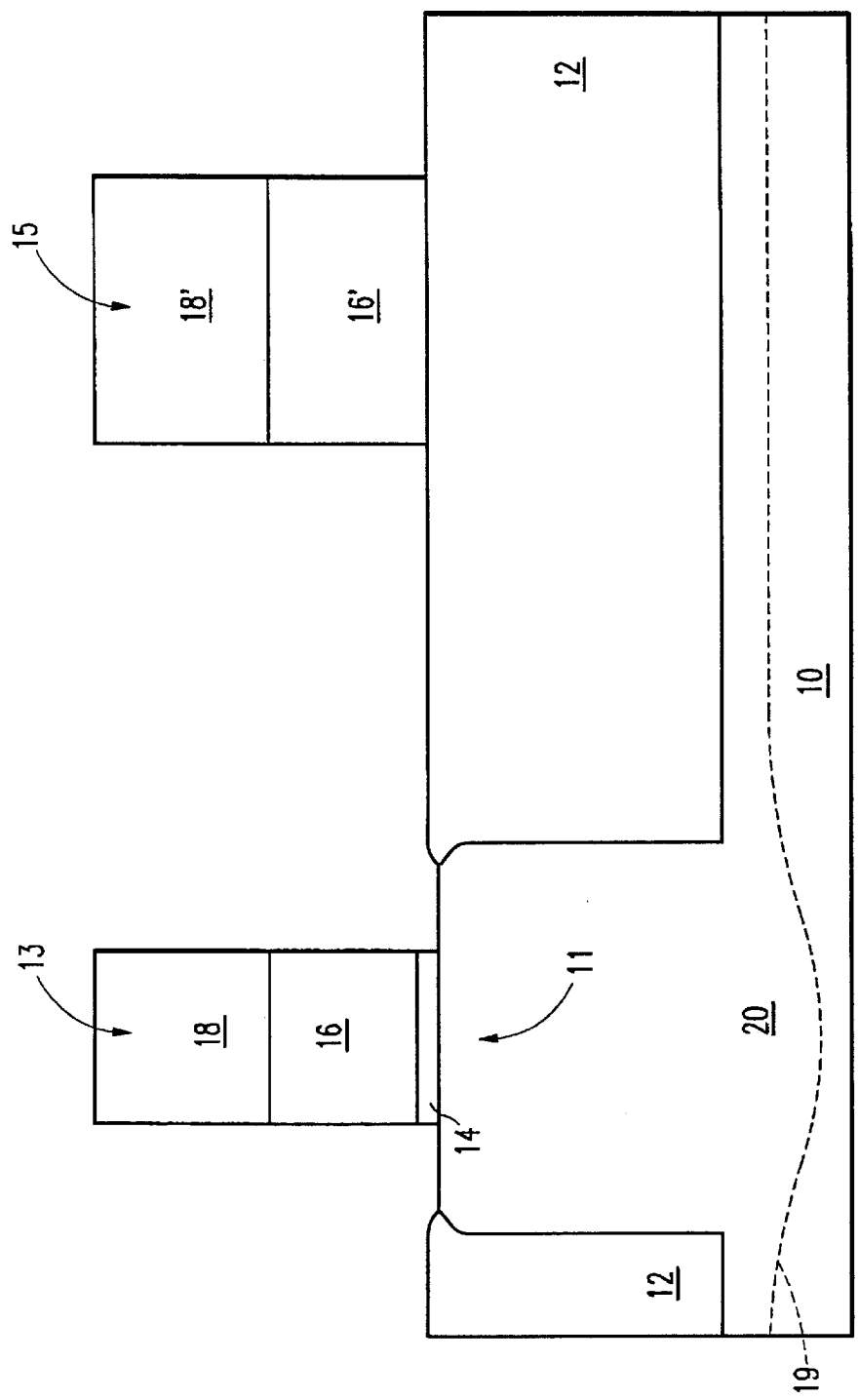
FIG. 1 is a schematic, cross-sectional representation of the IC device of the present invention after formation of the active regions, isolation regions and two gate electrode structures.

While the present invention may be embodied in many forms, details of a preferred embodiment are schematically shown in FIGS. 1 through 6, with the understanding that the present disclosure is not intended to limit the invention to the embodiment illustrated.

In accordance with a specific embodiment of the present invention, isolation regions 12 are first formed at the surface of a semiconductor substrate 10 to define active regions 11 for the semiconductor transistors to be fabricated. See FIG. 1. The isolation regions 12 may be field oxide (FOX) regions formed by the oxidation of selected portions of the surface of the substrate 10. A typical manufacturing process for making these FOX regions is the local oxidation of silicon (LOCOS) process. In this process, comparatively thick oxide (typically silicon oxide) layers partly or wholly inset in the silicon substrate are generated through the use of an oxidation-resistant silicon-nitride-containing masking layer (not shown in FIG. 1). Alternatively, the isolation regions 12 may be formed by other schemes known in the prior art such as trench isolation or shallow trench isolation.

After the isolation regions 12 are formed, dopants of a first type are typically implanted into the substrate 10 to form a lightly doped well region 20. The type and concentration of these first dopants depend upon the type of the well (p or n) and the desirable level of electron carriers in the well. Typically, boron ions are used for p-wells, phosphor ions are used for n-wells, and the concentration of either type of dopants is in the range of $1 \times 10^{16}$ to $1 \times 10^{17}$ per $cm^3$. Because these dopants penetrate deeper in the substrate 10 than in the isolation regions 12, the well region 20 shown in FIG. 1 has a profile 19 that is convex under the active region 11 toward the bottom of the substrate and essentially flat under the isolation regions 12.

Next, again as shown in FIG. 1, two gate electrode structures 13 and 15 are formed on top of each pair of an active-region 11 and its adjacent isolation region 12. The first gate electrode structure 13 is formed at the active region 11 and is comprised of a gate oxide layer 14, a first conductor layer (i.e., the gate electrode layer) 16, and a first dielectric layer 18, which are sequentially formed at the active region 11. Typically, the gate oxide layer 14 is a silicon oxide layer formed by a thermal or chemical vapor deposition (CVD) process. Typically, the gate oxide layer 14, the first gate electrode 16 and the first dielectric layer 18 of the first gate electrode structure 13 are, respectively, 1–10 nm, 100–300 nm and 10–200 nm thick.

The second gate electrode structure 15 is formed at the isolation region and is typically comprised of a first conductor layer (i.e., the gate electrode layer) 16' and a first dielectric layer 18', which are sequentially formed at the isolation region 12. Preferably, the first gate electrode 16 of the first gate electrode structure 13 and the second gate electrode 16' of the second gate electrode structure 15 are simultaneously formed by one process, while the first dielectric layers 18 of the first gate electrode structure 13 and the first dielectric layer 18' of the second gate electrode structure 15 are also formed simultaneously. The two gate electrode structures 13 and 15 thus formed have approximately the same height. The material constituting the first conductor layers 16 and 16' may be selected from polysilicon (poly-Si), metals, metal silicides, and multilayer materials such as poly-Si/tungsten silicide. The first dielectric layers 18 and 18' are typically silicon oxide layers formed by a CVD process. Typically, the thickness of the second gate electrode 16' and the first dielectric layer 18' of the second gate electrode structure 15 are, respectively, 100–300 nm and 10–200 nm thick.

Referring again to FIG. 1, note that the second gate structure has a larger surface area than the first gate structure, such that in a later processing step a self-aligned contact window can be easily formed on the second gate structure without resort to an additional lithographic step, as described in detail below.

Figure 2:
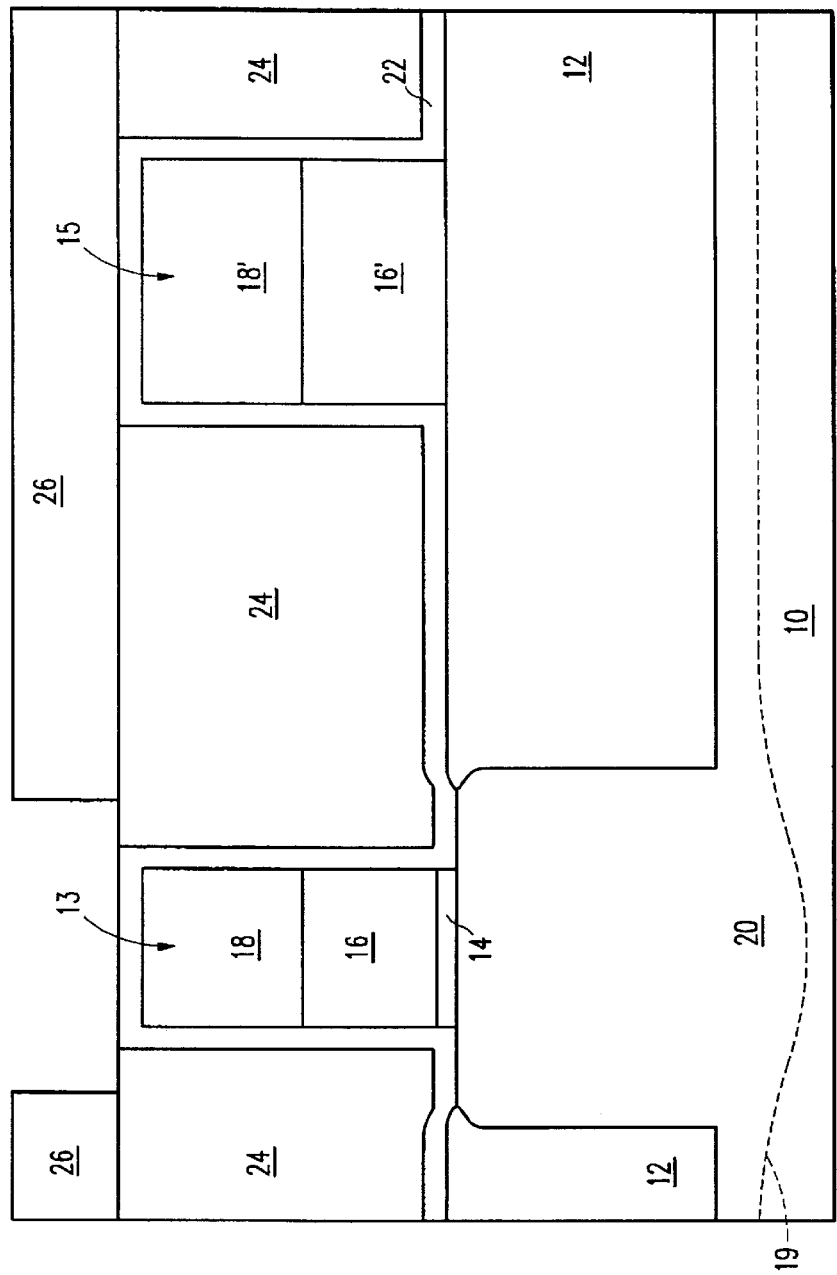
FIG. 2 is a schematic, cross-sectional representation of the IC device of the present invention after deposition of the second dielectric layer and the formation of the mask layer.

Next, as shown in FIG. 2, an etch-stop layer 22 is deposited on top of the entire substrate 10. This etch-stop layer 22 is typically made of $Si_3N_4$ or $SiN_xO_y$, and is approximately 10–100 nm thick. Preferably, it is formed by a conforming deposition process such as CVD so that it covers uniformly the two gate electrode structures 13 and 15. This etch-stop layer 22 will serve as the etch stop in a subsequent etching process.

Again referring to FIG. 2, a second dielectric layer 24 is deposited to cover the entire substrate 10 and the gate electrode structures 13 and 15, now covered by the etch-step layer 22. The as-deposited dielectric layer 24 is then planarized by, e.g., chemical-mechanical polishing (CMP), to expose the gate electrode structures 13 and 15, which are covered on the top by the etch-stop layer 22. This second dielectric layer 24 is made of a material sufficiently different from that of the etch-stop layer 22 in order for the latter to act as the etch stop in the etching process. Typically, the second dielectric layer 24 is a $SiO_2$ layer deposited by a CVD process. A first mask layer (e.g., a photoresist) 26 is then deposited and patterned on top of the second dielectric layer 24 and the second gate electrode structure 15, as shown in FIG. 2. Notably, in contrast to the teaching of the conventional art, the first mask layer 26 does not cover the first gate electrode structure 13. Thus, this first mask layer 26, in conjunction with the first gate electrode structure 13, forms self-aligned contact windows that defines the location of the gate and drain electrodes.

Figure 3:
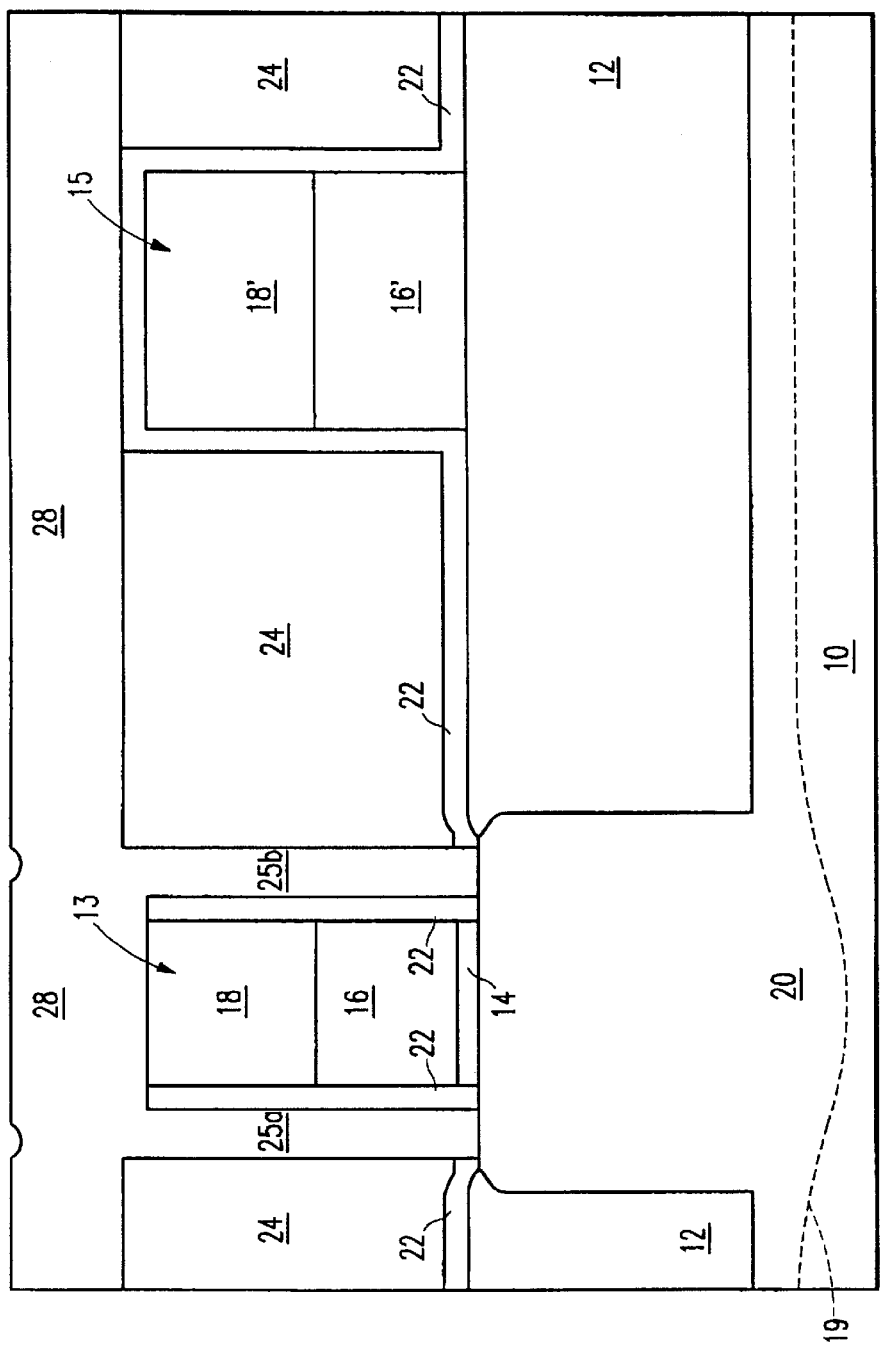
FIG. 3 is a schematic, cross-sectional representation of the IC device of the present invention after deposition of the second conductor material.

Next, as shown in FIG. 3, those portions of the second dielectric layer 24 that are not masked by the first mask layer 26 (shown in FIG. 2), together with their underlying portions of the etch-stop layer 22, are removed by an anisotropic etching process. Typically, fluorine plasma is used as the etchant in this anisotropic etching process. As a result, two trenches 25a and 25b are formed at the locations earmarked for the gate and drain electrodes. The first mask layer 26 (shown in FIG. 2) is then removed. Subsequently, a second conductor material is deposited on top of the entire semiconductor structure, forming a second conductor layer 28 as well as filling up the trenches 25a and 25b. This second conductor material can conveniently be selected from poly-Si, epitaxial Si, metal silicides and metals such as tungsten.

Figure 4:
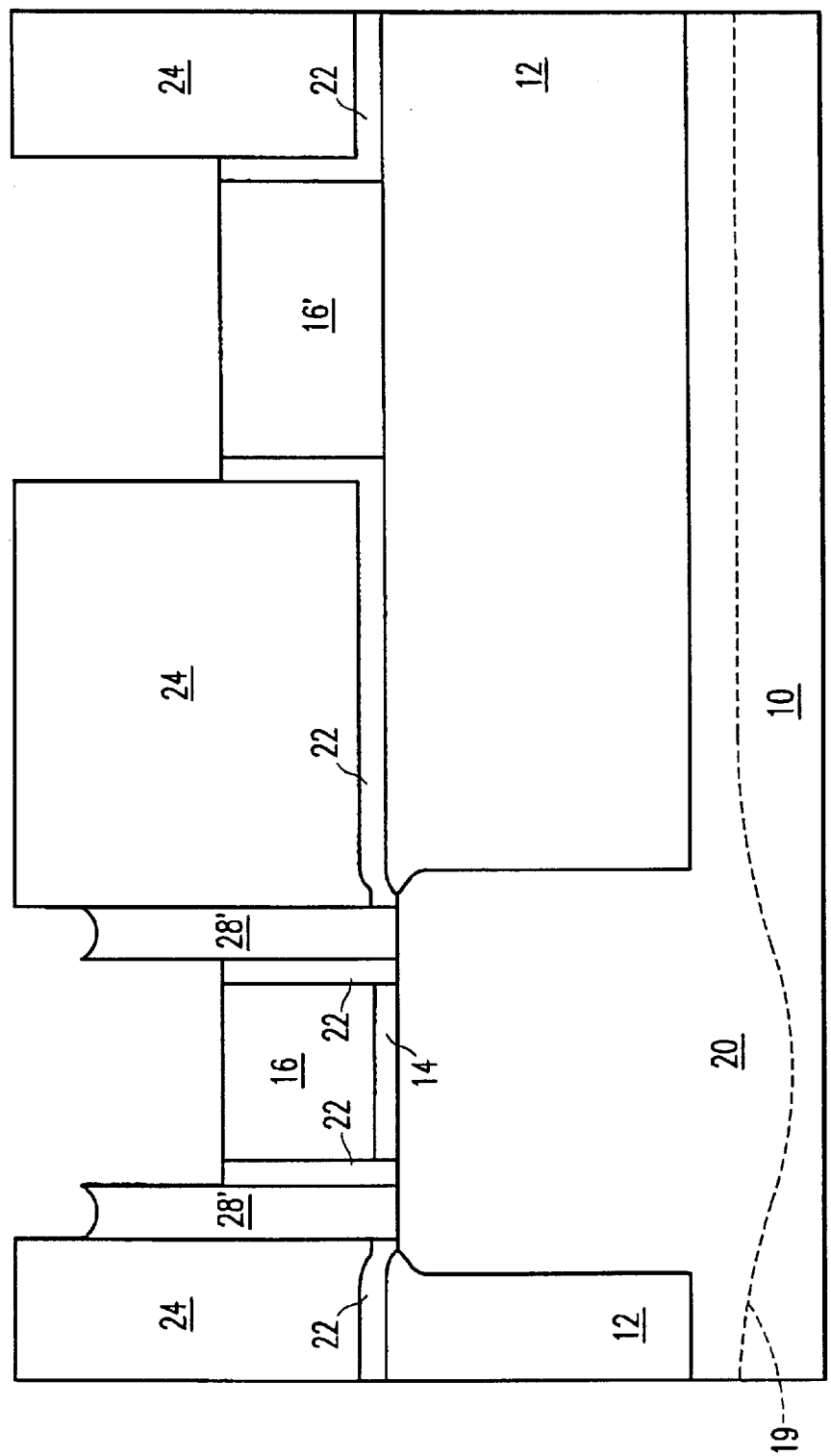
FIG. 4 is a schematic, cross-sectional representation of the IC device of the present invention after removal of the first dielectric layers of the gate electrode structures.

Next, as shown in FIG. 4, a CMP or back-etch process, or both, are conducted to remove all the as-deposited second conductor material 28 on top of the semiconductor structure. Preferably, the top portion of the conductor columns filling the trenches 25a and 25b is also removed, such that the conductor columns 28' remaining in the trenches have a height lower than that of the gate electrode structure 13 (as shown in FIG. 3) to avoid short-circuiting between the two conductor columns 28'.

Again referring to FIG. 4, an etching process is conducted to remove the first dielectric layers 18 and 18' (shown in FIG. 3) and those portions of the etch-stop layer 22 that are either on top of the dielectric layer 18' or along the side of the dielectric layers 18 and 18' (all shown in FIG. 3) to expose the top surfaces of the gate electrode layers 16 and 16'. A second type of dopants is then implanted, typically via an ion implantation process, into the conductor columns 28'; the type and concentration of these second dopants depend upon the type and desirable level of electron carriers in the source and drain electrodes, as described below. These second-type dopants are also implanted into the first conductor layers 16 and 16', thus forming the dual gate electrodes 16 and 16'.

Figure 5:
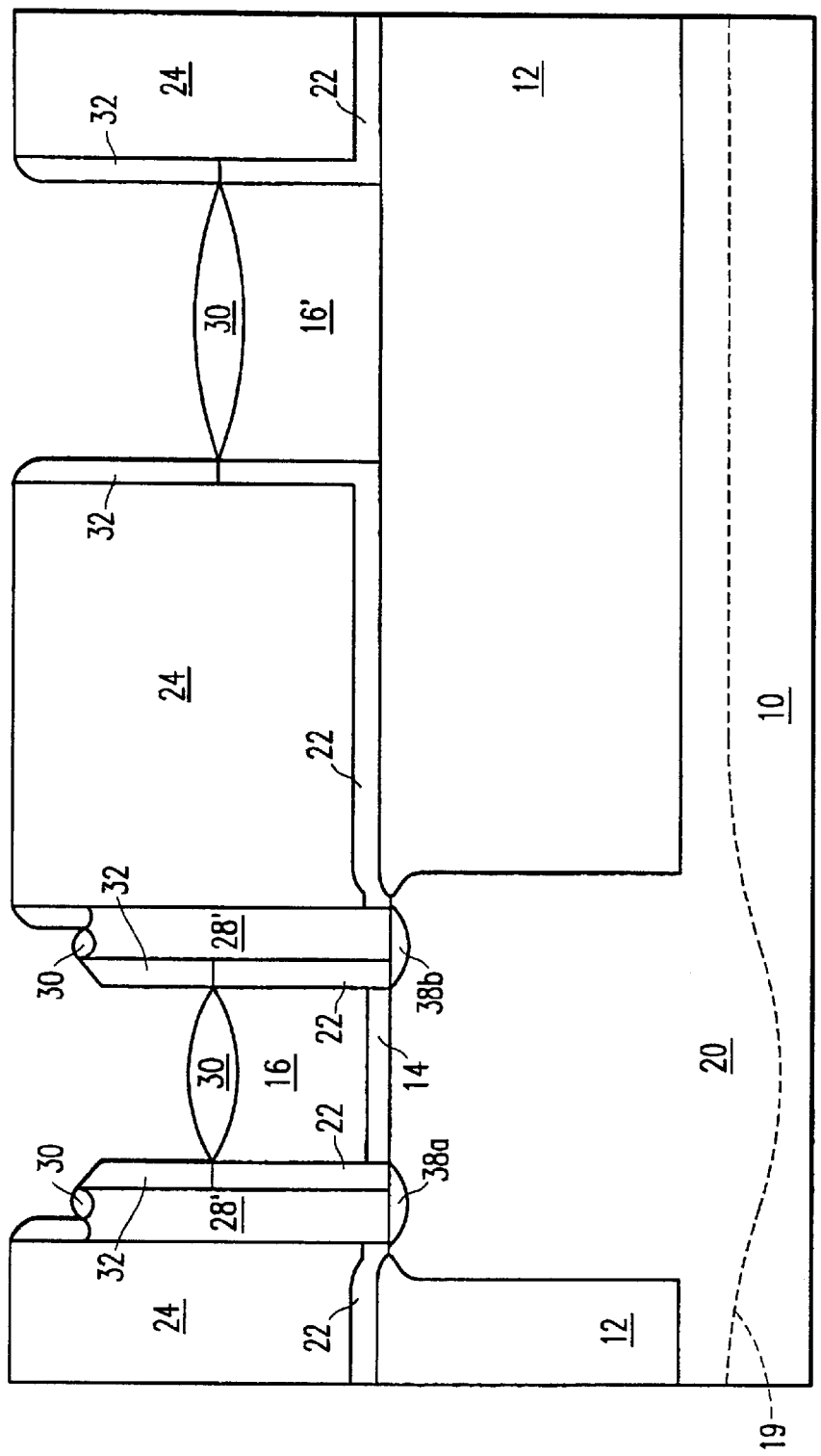
FIG. 5 is a schematic, cross-sectional representation of the IC device of the present invention after formation of the raised source and drain and the self-aligned silicides at the conductor columns and the second gate electrode layer.

Next, as shown in FIG. 5, an optional thermal annealing processing step may be conducted so that the second-type dopants are evenly distributed in the conductor columns 28' as well as diffuse into the surface regions of the substrate 10 directly beneath the columns 28', thus forming a raised source 38a and a raised drain 38b. This annealing process would also result in the even distribution of the dopants in the gate electrodes 16 and 16'.

Also referring to FIG. 5, side walls 32 comprised of a third dielectric material is formed on the exposed side of each conductor column 28' as well the exposed sides of the second dielectric layer 24. These side walls are typically formed by the following process: first, a third dielectric layer is deposited by a CVD process; second, an anisotropic etching process is conducted to remove superfluous portions of the third dielectric layers. The side walls thus formed will prevent short-circuiting between the conductor columns 28 and other conductors.

Again referring to FIG. 5, by use of processing steps known to those skilled in the art, self-aligned metal suicides 30 may conveniently be formed on top of the conductor columns 28' and the two gate electrodes 16 and 16'. These silicides 30 will reduce the resistance between these conductors and interconnects to be formed thereon, and can be selected from the suicides of nickel, titanium, cobalt and platinum. Notably, by properly adjusting the operating parameters of the thermal treatment of the as-deposited metal and silicon, which treatment is requisite for the formation of silicides, the aforesaid diffusion of the second-type dopants may be achieved at the same time as the silicides are formed without the need for the aforesaid optional thermal annealing step.

Figure 6:
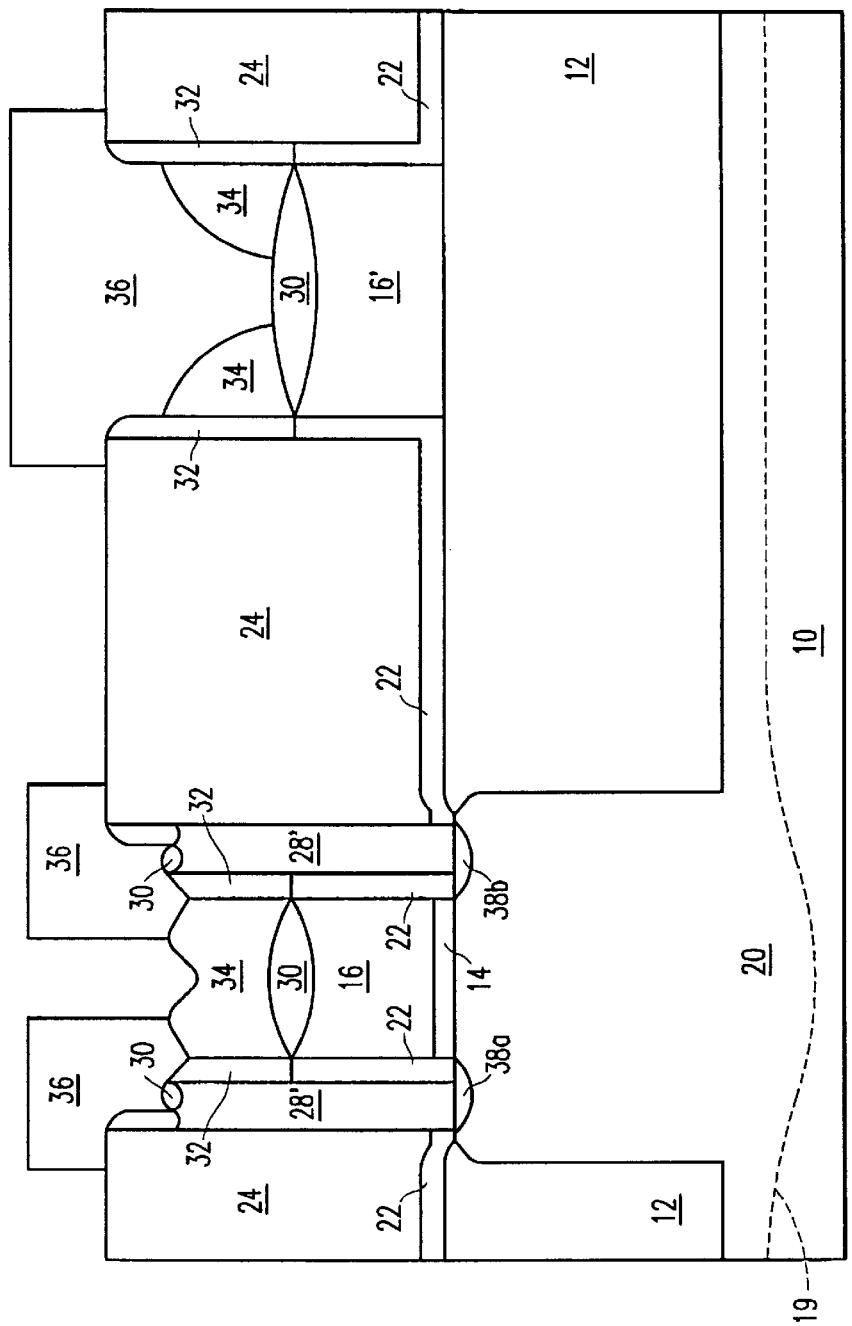
FIG. 6 is a schematic, cross-sectional representation of the IC device of the present invention after formation of the interconnects at the self-aligned contact windows.

Next, as shown in FIG. 6, a fourth dielectric material is formed on top of the first gate electrode 16 and the second gate electrode 16'. Typically, the as-deposited dielectric material is typically back-etched such that the remaining fourth dielectric layers 34 cover the entire first gate electrode 16 but only portions of the second gate electrode 16'. The formation of the fourth dielectric layers 34 can be controlled by adjusting the process parameters (e.g., duration) of the processing steps.

Finally, by use of conventional processing steps such as CVD deposition, photomasking and etching, interconnects 36 are formed at the contact windows intended for such interconnects 36. A typical interconnect material is the Al—Cu alloy. Thus, interconnects 36 are formed to connect the conductor columns 28' (and hence the raised source 38a and drain 38b) and the second gate electrode 16' to other transistors and other IC components (not shown) located on the same semiconductor substrate 10. Notably, the interconnects 36 can be formed directly at the contact windows without having to first conduct lithographic and/or etching processes to form such contact windows on top of the second gate electrode 16'.

While the invention has been particularly shown and described with reference to the above preferred embodiment, it will be understood by those skilled in the art that many other modifications and variations may be made thereto without departing from the broader spirit and scope of the invention as set forth in the claims. The specification and drawings are accordingly to be regarded as an illustrative, rather than restrictive.

What is claimed is:

1. An IC device fabricated on a substrate, comprising a plurality of IC components including a plurality of MOS transistors, at least one of said MOS transistors having:

an active region comprising a raised source, a raised drain, a first gate electrode, a first self-aligned interconnect, and a second self-aligned interconnect and a conductor column between the first self-aligned interconnect and the raised source, said first gate electrode located between said raised source and said raised drain, said first interconnect connecting said raised source to at least one of said IC components, and said second interconnect connecting said raised drain to at least one of said IC components; and an isolation region comprising a second gate electrode and a third self-aligned interconnect, said third interconnect connecting said second gate electrode to at least one of said IC components, and said second gate electrode separated from said first gate electrode by a dielectric layer.

2. The IC device of claim 1, wherein each of said first, second and third interconnects includes a metal layer and a self-aligned silicide layer.

3. The IC device of claim 2, wherein said silicide layer is made of material selected from the group consisting of nickel silicide, titanium silicide, cobalt silicide and platinum silicide.

4. The IC device of claim 2, wherein both said active region and said isolation region are located within a well region of said substrate doped with a first type of dopants in the range of $1 \times 10^{16}$ to $1 \times 10^{17}$ per $cm^3$.

5. The IC device of claim 4, wherein said second gate electrode occupies a larger surface area of said substrate than said first gate electrode.

6. The IC device of claim 4, wherein each of said first gate electrode and said second electrode is made of material selected from the group consisting of polysilicon, metal and metal silicide.

* * * * *